(12) United States Patent
Chiba

(10) Patent No.: US 7,695,306 B2
(45) Date of Patent: Apr. 13, 2010

(54) ELECTRONIC PART-CONNECTING STRUCTURE

(75) Inventor: Shingo Chiba, Makinohara (JP)

(73) Assignee: Yazaki Corporation, Tokyo (JP)

( * ) Notice: Subject to any disclaimer, the term of this patent is extended or adjusted under 35 U.S.C. 154(b) by 175 days.

(21) Appl. No.: 12/099,536

(22) Filed: Apr. 8, 2008

(65) Prior Publication Data

US 2009/0251877 A1    Oct. 8, 2009

(51) Int. Cl.
*H01R 4/26* (2006.01)

(52) U.S. Cl. .......................... 439/404; 439/698

(58) Field of Classification Search ............... 439/395, 439/404, 620.21, 620.26, 698
See application file for complete search history.

(56) References Cited

U.S. PATENT DOCUMENTS

| | | | | | |
|---|---|---|---|---|---|
| 4,113,341 | A | * | 9/1978 | Hughes | 439/620.21 |
| 5,046,968 | A | * | 9/1991 | Baur et al. | 439/620.21 |
| 5,154,639 | A | * | 10/1992 | Knoll et al. | 439/620.21 |
| 5,846,098 | A | * | 12/1998 | Shiga et al. | 439/409 |

FOREIGN PATENT DOCUMENTS

JP    10-003953 A    1/1998

* cited by examiner

*Primary Examiner*—Khiem Nguyen
(74) *Attorney, Agent, or Firm*—Sughrue Mion, PLLC

(57) ABSTRACT

An electronic part-connecting structure is used in an electrical equipment including a housing, and bus bars which are mounted on the housing and have a plurality of pairs of opposed press-contacting blades to which electronic parts for circuit-protecting purposes are electrically connected by pressing. Positioning ribs are formed in proximity respectively to the press-contacting blades so as to position lead portions of the electronic parts at the respective press-contacting blades.

4 Claims, 6 Drawing Sheets

ELECTRONIC PART-CONNECTING STRUCTURE

BACKGROUND OF THE INVENTION

1. Filed of the Invention

This invention relates to an electronic part-connecting structure used for electrically connecting electronic parts, for example, to a circuit of an illumination unit for illuminating a passenger compartment of an automobile.

2. Related Art

There is known a conventional electronic part-connecting structure in which pressing projections are formed respectively on opposed inner surfaces of an electronic part-holding body (see, for example, JP-A-10-3953).

In the electronic part-connecting structure disclosed in JP-A-10-3953, when the electronic part-holding body 150 holding an electronic part 160 is fitted into an electronic part-receiving chamber 151, the electronic part-holding body 150 is fixed to this electronic part-receiving chamber 151, and each lead wire 161 of the electronic part 160 held by the electronic part-holding body 150 is press-fitted into a U-shaped slot 152, and is held by right and left press-contacting piece portions 153 and 153, as shown in FIG. 6. At the same time, the pressing projections 155 and 155 are fitted respectively in retaining portions 154 and 154 of the press-contacting piece portions 153 and 153, so that right and left walls 156 and 156 respectively urge the two press-contacting piece portions 153 and 153 toward each other through the pressing projections 155 and 155, and therefore the press-contacting piece portions 153 and 153 are pressed against the lead wire 161 to hold the same therebetween.

However, in the conventional electronic part-connecting structure disclosed in JP-A-10-3953, when a covering portion of the electronic part 160 covering an element portion thereof is located in the U-shaped slot 152 between the press-contacting piece portions 153 at the time of mounting the electronic part 160, the press-contacting piece portions 153 grip (that is, bite into) the covering portion, and as a result there is a fear that the electrical connection may be insufficient, so that the reliability is lowered.

SUMMARY OF THE INVENTION

This invention has been made in view of the above circumstances, and an object of the invention is to provide an electronic part-connecting structure in which electrical connection of an electronic part can be positively effected, thereby obtaining a high reliability.

1) An electronic part-connecting structure of the present invention for use in an electrical equipment comprising a housing, and a bus bar which is mounted on the housing and has opposed press-contacting blades to which an electronic part for circuit-protecting purposes is electrically connected by pressing; characterized in that positioning ribs are formed in proximity respectively to the press-contacting blades so as to position the electronic part so that the press-contacting blades will not be press-contacted with a covering portion of lead portions of the electronic part.

In the invention of the above Paragraph 1), when the electronic part is to be electrically connected to the bus bar, first, the electronic part is placed on the press-contacting blades, and at this time the positioning ribs disposed in proximity respectively to the press-contacting blades position the lead portions of the electric part at the press-contacting blades, respectively. The electronic part has the covering portion covering its element portion, and the lead portions project respectively from opposite ends of the covering portion. Because of the provision of the positioning ribs, the covering portion is not brought into engagement with the press-contacting blades, but the lead portions are brought into engagement with the respective press-contacting blades. Furthermore, the positioning ribs are disposed in proximity to the press-contacting blades, respectively, and therefore stresses, applied to the press-contacting blades when the lead portions of the electronic part are press-fitted respectively into the press-contacting blades, are received by the positioning ribs, and therefore the press-contacting blades can be prevented from tilting and twisting. Therefore, the covering portion will not be connected to the press-contacting blades, and the lead portions are positively connected to the press-contacting blades, respectively, and thus the electrical connection of the electronic part can be positively effected, so that the high reliability can be obtained.

2) The electronic part-connecting structure of the above Paragraph 1) is characterized in that each of the press-contacting blades has a lead portion insertion groove for the insertion of the lead portion of the electronic part thereinto, and each of the positioning ribs has a covering portion insertion groove for abutting against the covering portion of the electronic part, the covering portion insertion groove being similar in shape to the lead portion insertion groove.

In the invention of the above Paragraph 2), when the electronic part is placed on the press-contacting blades, the covering portion of the electronic part abuts against the covering portion insertion grooves of the positioning ribs, and is supported by the positioning ribs, and therefore the covering portion will not be disposed on the press-contacting blades. Furthermore, the covering portion insertion grooves of the positioning ribs are similar in shape to the lead portion insertion grooves of the press-contacting blades, and therefore the positioning ribs will not adversely affect the insertion of the lead portions at all, and by pressing the electronic part, only the lead portions can be inserted into the respective lead portion insertion grooves of the press-contacting blades and can be electrically connected to the respective press-contacting blades.

3) The electronic part-connecting structure of the above Paragraph 1) or Paragraph 2) is characterized in that the press-contacting blades are formed by bending stamped-out portions of the bus bar, and the positioning ribs are formed at a bus bar fixing portion of the housing.

In the invention of the above Paragraph 3), the press-contacting blades are formed by bending the stamped-out portions of the bus bar. Therefore, the press-contacting blades are formed simultaneously when forming the bus bar into the predetermined shape by pressing and bending, and therefore the bus bar having these press-contacting blades can be produced without using any complicated process, so that the productivity can be enhanced. Furthermore, the positioning ribs are formed simultaneously when forming the bus bar fixing portion in the molding of the housing, and therefore the housing having these positioning ribs can be produced without the need for preparing a new mold and therefore without a large plant investment.

4) The electronic part-connecting structure of any one of the above Paragraphs 1) to 3) is characterized in that the bus bar comprises a pair of bus bars, and a light source is connected in series with one of the bus bars and the other of the bus bars, and the electronic part is connected in parallel with or in series with the pair of bus bars.

In the invention of the above Paragraph 4), the light source is connected in series with one of the bus bars and the other of the bus bars, and the element for circuit protecting purposes such for example as a Zener diode, a resistor, etc., is connected in parallel with or in series with the pair of bus bars. With this arrangement, the electrical equipment can be used as an illumination unit for illuminating a passenger compartment of an automobile.

The electronic part-connecting structure of the present invention can solve the problem that the reliability is lowered by the insufficient electrical connection, and therefore the electrical connection of the electronic part can be positively effected, so that the high reliability can be obtained.

BRIEF DESCRIPTION OF THE DRAWINGS

FIG. 1 is a perspective view of an illumination unit employing an electronic part-connecting structure of the present invention as seen obliquely from the upper side.

DETAILED DESCRIPTION OF THE PREFERRED EMBODIMENTS

A preferred embodiment of the present invention will now be described in detail with reference to the drawings.

Figure 1A:
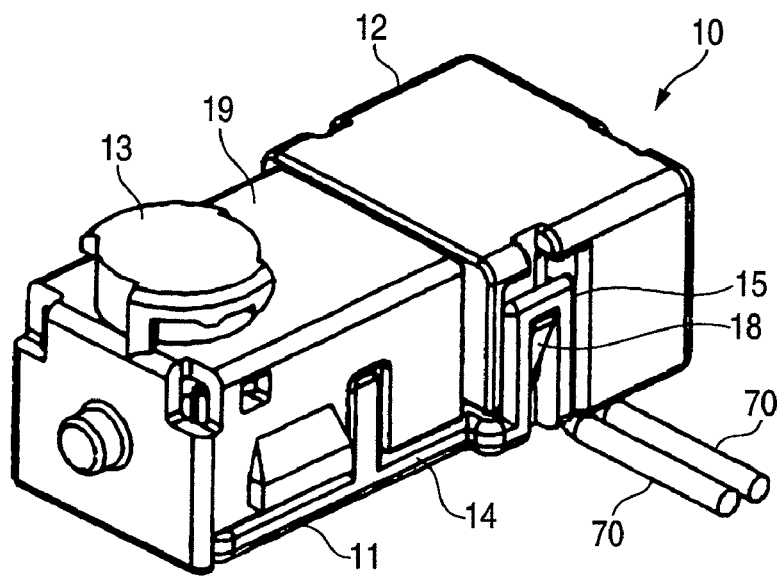
FIG. 1A shows one preferred embodiment of an electronic part-connecting structure.
Figure 1B:
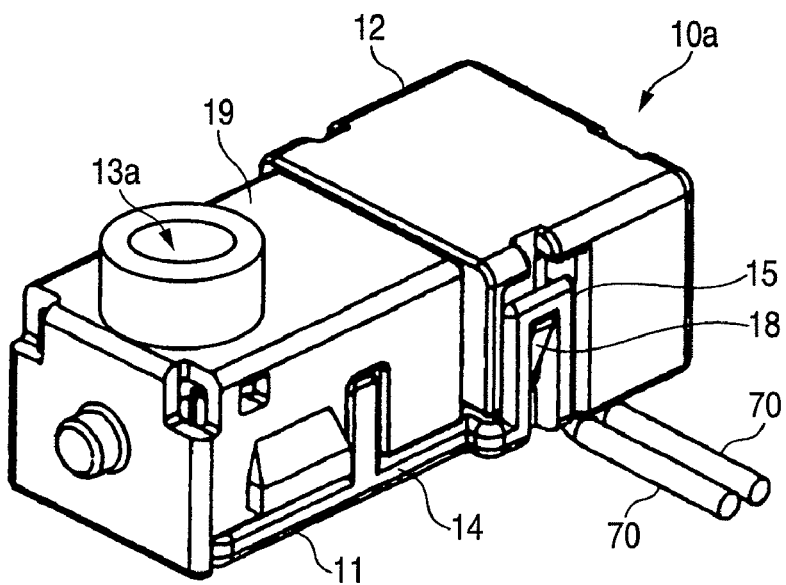
FIG. 1B shows a modified electronic part-connecting structure.
Figure 2:
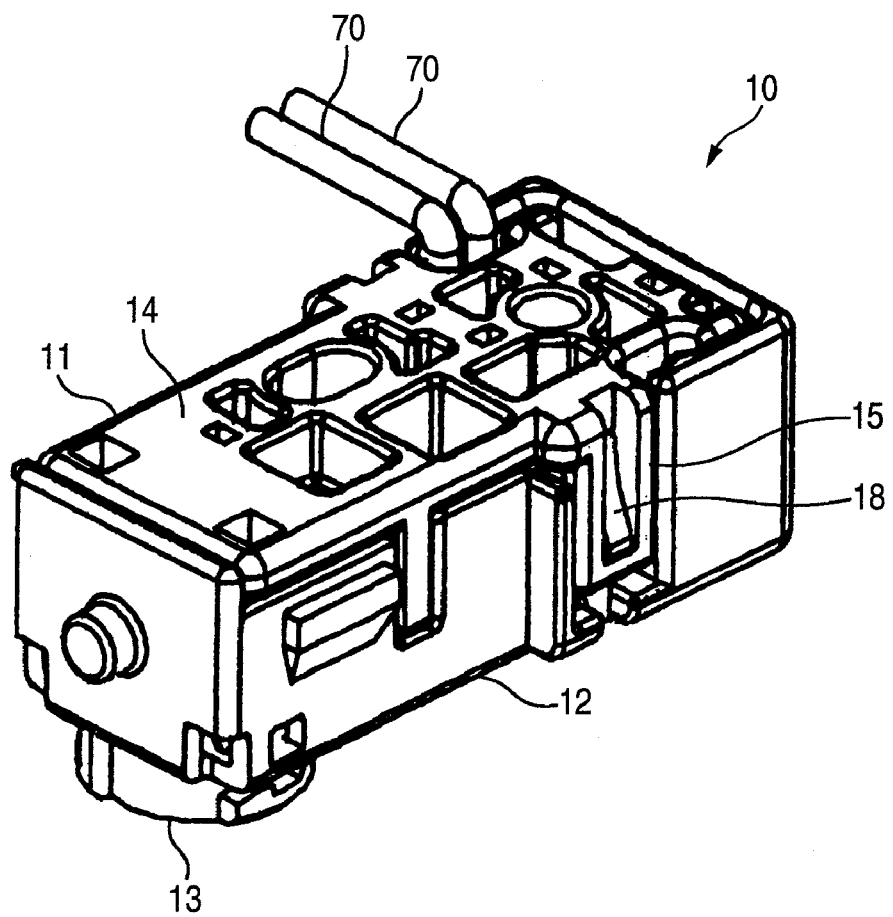
FIG. 2 is a perspective view of the illumination unit of FIG. 1 as seen obliquely from the lower side.
Figure 3:
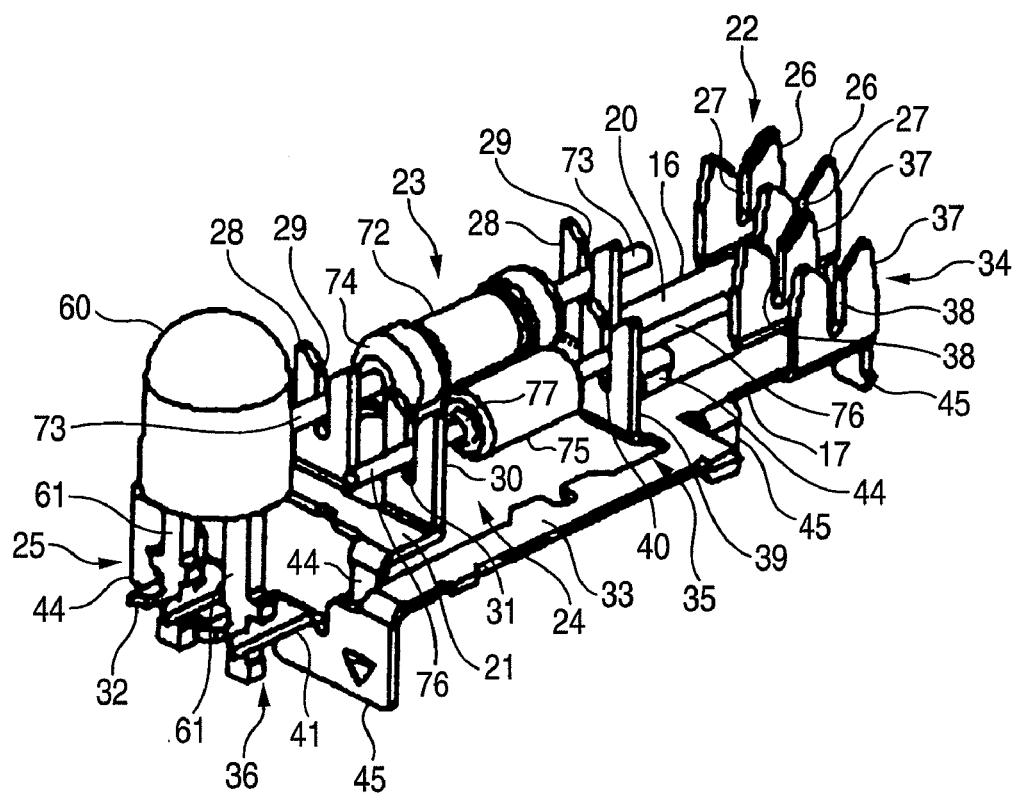
FIG. 3 is a perspective view showing bus bars used in the illumination unit of FIG. 1.
Figure 4:
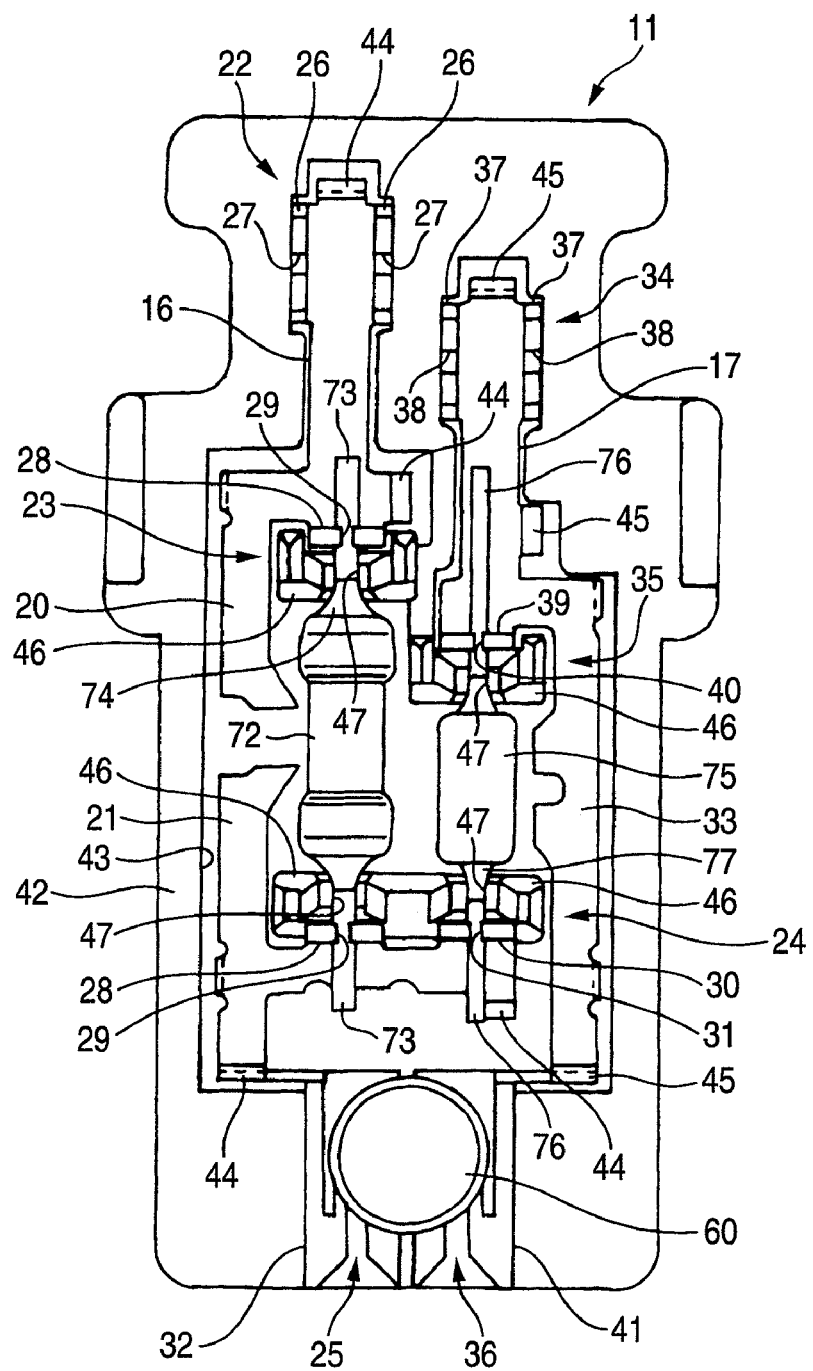
FIG. 4 is a plan view of a housing of the illumination unit of FIG. 1.
Figure 5:
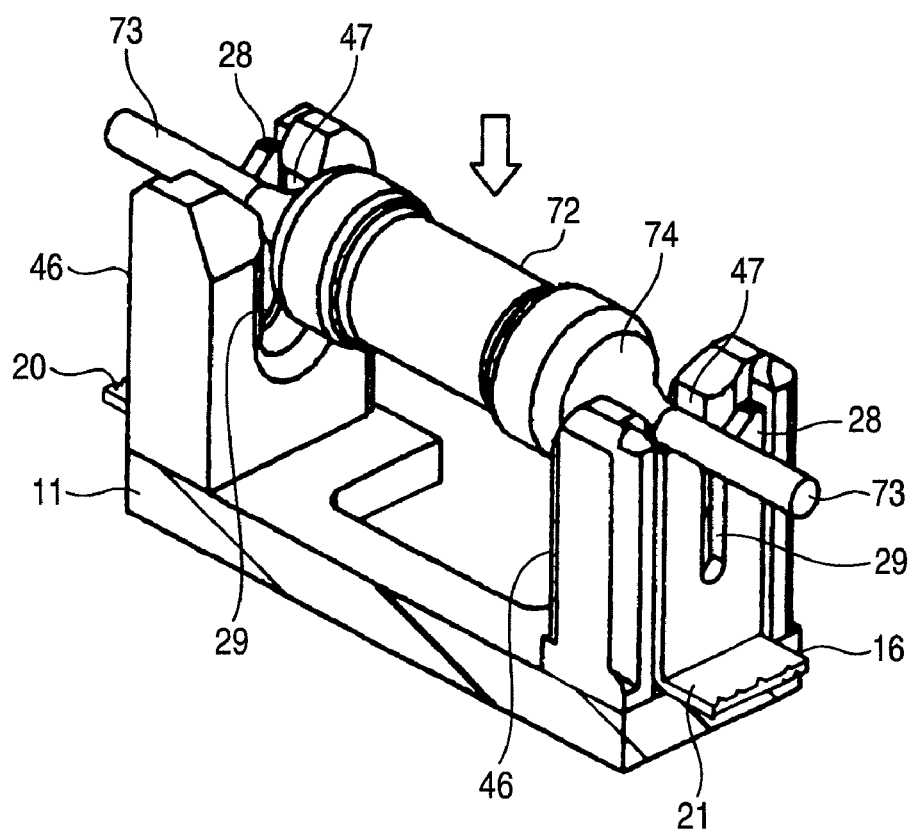
FIG. 5 is a fragmentary perspective view showing a condition in which an electronic part is mounted on the bus bars of FIG. 3.
Figure 6:
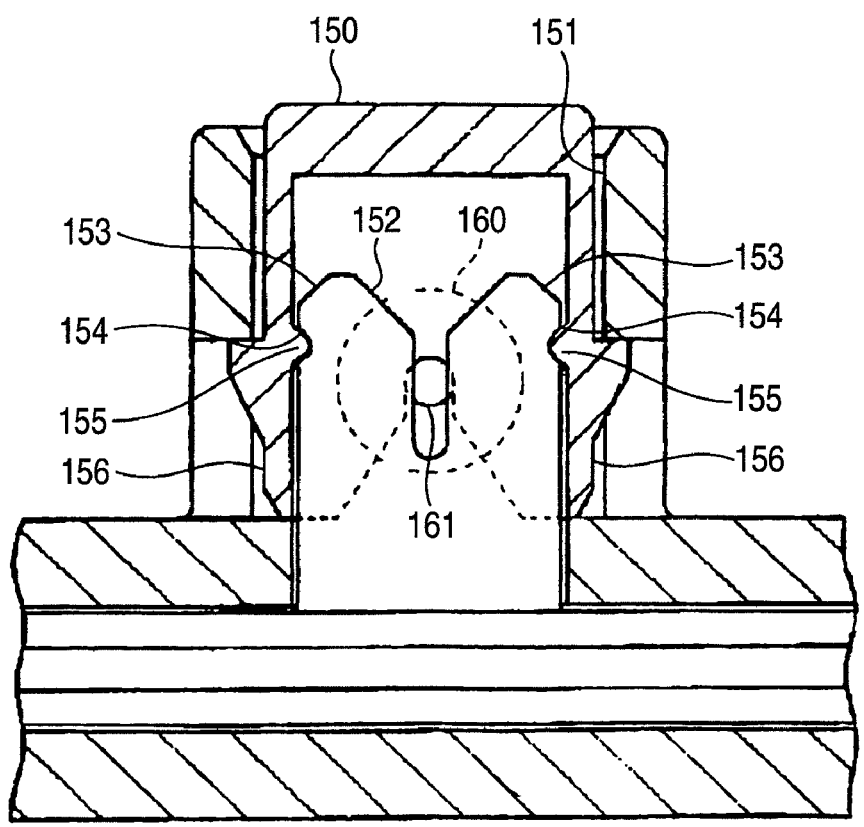
FIG. 6 is a cross-sectional view of a conventional electronic part-connecting structure.

FIG. 1 is a perspective view of an illumination unit employing one preferred embodiment of an electronic part-connecting structure of the invention as seen obliquely from the upper side, FIG. 2 is a perspective view of the illumination unit of FIG. 1 as seen obliquely from the lower side, FIG. 3 is a perspective view showing bus bars used in the illumination unit of FIG. 1, FIG. 4 is a plan view showing a housing of the illumination unit of FIG. 1, and FIG. 5 is a fragmentary perspective view showing a condition in which an electronic part is mounted on the bus bars of FIG. 3.

As shown in FIGS. 1 and 2, the illumination unit 10 employing the electronic part-connecting structure of the invention comprises the housing 11, and a cover 12 having an LED cap 13 mounted thereon.

The housing 11 is made of a non-conductive resin, and includes a rectangular plate-like body 14, and a pair of U-shaped engagement portions 15 and 15 formed respectively at opposite side edges of the body 14. The cover 12 is attached to the housing 11 through the engagement portions 15 and 15. The pair of bus bars 16 and 17 (described later) are mounted on the housing 11, and also an LED 60 (described later) serving as a light source is mounted on the housing 11. Wires 70 and 70 are electrically connected respectively to the bus bars 16 and 17, and these wires 70 and 70 are led out to the exterior, and are connected to an illumination circuit (not shown) via a connector (not shown), etc. One of the wires 70 and 70 is the power wire (+), while the other wire 70 is the grounding wire (−).

Like the housing 11, the cover 12 is made of a non-conductive resin, and is formed into such a shape as to cover the outside of the body 14 of the housing 11. The cover 12 includes a pair of retaining projections 18 and 18 formed respectively at its opposite side portions, and these retaining projections 18 and 18 are brought into retaining engagement with the engagement portions 15 and 15 of the housing, respectively. The LED cap 13 is fixed to a top wall 19 of the cover 12. The LED cap 13 is a transparent or a translucent lens. Incidentally, this LED cap 13 does not always need to be transparent, and a hole may be formed in the cap 13, or the provision of the cap 13 may be omitted, in which case an outwardly-open hole 13a is formed in the cover 12 (see FIG. 1B).

Next, the internal structure of the illumination unit 10 will be described with reference to FIGS. 3 and 4.

As shown in FIG. 3, the bus bars 16 and 17 are made of electrically-conductive metal, and one bus bar 16 for connection to the power source is divided into two sections, that is, bus bar bodies 20 and 21 each having a flat plate-shape. A wire connection portion 22, a Zener diode connection portion 24, a resistor connection portion 23 and an LED connection portion 25 are formed on the bus bar 16.

The wire connection portion 22 comprises a pair of press-contacting blades 26 and 26 each having a wire insertion groove 27 of a U-shape, and when the one wire 70 is press-fitted into the wire insertion grooves 27 and 27 of the press-contacting blades 26 and 26, a sheath (not shown) of the wire 70 is cut by the press-contacting blades 26 and 26, so that a conductor (not shown) of the wire 70 is electrically connected to the press-contacting blades 26 and 26.

The resistor connection portion 23 comprises a pair of press-contacting blades 28 and 28 formed respectively on the two separate bus bar bodies 20 and 21, and a lead portion insertion groove 29 of a U-shape is formed in each of the press-contacting blades 28 and 28. A width of each lead portion insertion groove 29 is slightly smaller than an outer diameter of each of two lead portions 73 and 73 of a resistor 72, and therefore when the pair of lead portions 73 and 73 of the resistor 72 are press-fitted respectively into the pair of lead portion insertion grooves 29 and 29, the lead portions 73 and 73 are electrically connected to the press-contacting blades 28 and 28, respectively. When the resistor 72 is thus electrically connected to the two press-contacting blades 28 and 28, the resistor 72 is connected in series with the two separate bus bar bodies 20 and 21, and serves to attenuate a back electromotive force produced in the circuit at the time of a switching operation, or serves to protect the LED from a rush current.

The Zener diode connection portion 24 comprises a single press-contacting blade 30, and a lead portion insertion groove 31 of a U-shape is formed in the press-contacting blade 30. A width of the lead portion insertion groove 31 is slightly smaller than an outer diameter of one lead portion 76 of a Zener diode 75, and therefore when the one lead portion 76 of the Zener diode 75 is press-fitted into the lead portion insertion groove 31, this lead portion 76 is electrically connected to the press-contacting blade 30.

The LED connection portion 25 comprises a single press-contacting blade 32, and when one lead portion 61 of the LED 60 is press-fitted into the press-contacting blade 32, this lead portion 61 is electrically connected to the press-contacting blade 32.

The other bus bar 17 for connection to the ground comprises a flat plate-like bus bar body 33, and a wire connection portion 34, a Zener diode connection portion 35 and an LED connection portion 36 are formed on the bus bar body 33.

The wire connection portion 34 comprises a pair of press-contacting blades 37 and 37 each having a wire insertion groove 38 of a U-shape, and when the other wire 70 is press-fitted into the wire insertion grooves 38 and 38 of the press-contacting blades 37 and 37, a sheath (not shown) of the wire 70 is cut by the press-contacting blades 37 and 37, so that a conductor (not shown) of the wire 70 is electrically connected to the press-contacting blades 37 and 37.

The Zener diode connection portion 35 comprises a single press-contacting blade 39, and a lead portion insertion groove 40 of a U-shape is formed in the press-contacting blade 39. A width of the lead portion insertion groove 40 is slightly smaller than an outer diameter of the other lead portion 76 of the Zener diode 75, and therefore when the other lead portion 76 of the Zener diode 75 is press-fitted into the lead portion insertion groove 40, this lead portion 76 is electrically connected to the press-contacting blade 39. The Zener diode 75 is electrically connected at the one lead portion 76 thereof to the one bus bar 16, and also is electrically connected at the other lead portion 76 thereof to the other bus bar 17, and therefore the Zener diode 75 is connected in parallel with the pair of bus bars 16 and 17 at a downstream side of the resistor 72. With this arrangement, with respect to a direction of flow of a forward electromotive force in the diode, the Zener diode 75 serves to protect the LED from breakdown due to a sudden large voltage applied to the circuit by static electricity, and also with respect to a direction of flow of a back electromotive force in the diode, the Zener diode prevents the energization, thereby protecting the LED from breakdown.

The LED connection portion 36 comprises a single press-contacting blade 41, and when the other lead portion 61 of the LED 60 is press-fitted into the press-contacting blade 41, this lead portion 61 is electrically connected to the press-contacting blade 41. The LED 60 is electrically connected to the pair of bus bars 16 and 17, and emits light when a current is supplied thereto via the wire 70.

The press-contacting blades 26, 26, 28, 28, 30 and 32 of the one bus bar 16 are formed by bending stamped-out portions of the bus bar bodies 20 and 21, and similarly the press-contacting blades 37, 37, 39 and 41 of the other bus bar 17 are formed by bending stamped-out portions of the bus bar body 33.

As shown in FIG. 4, a bus bar fixing portion 43 having a shape generally corresponding to combined shapes of the two bus bars 16 and 17 is formed in the housing 11, and is recessed from an upper surface 42 of the body 14. Four retaining piece portions 44, 44, 44 and 44 are formed on and project downwardly from outer edges of the bus bar bodies 20 and 21 of the one bus bar 16, and three retaining piece portions 45, 45 and 45 are formed on and project downwardly from an outer edge of the bus bar body 33 of the other bus bar 17. By inserting the four retaining piece portions 44 and the three retaining piece portions 45 in the bus bar fixing portion 43, the two bus bars 16 and 17 are mounted on the housing 11 in fixed relation thereto.

Four positioning ribs 46, 46, 46 and 46 are formed at the bus bar fixing portion 43 of the housing 11. More specifically, the two positioning ribs 46 and 46 are provided respectively at the inner sides of the pair of press-contacting blades 28 and 28 (for the connection of the resistor 72 thereto), and contact these press-contacting blades 28 and 28, respectively. The other two positioning ribs 46 and 46 are provided respectively at the inner sides of the pair of press-contacting blades 30 and 39 (for the connection of the Zener diode 75 thereto), and contact these press-contacting blades 30 and 39, respectively. The four positioning ribs 46, 46, 46 and 46 have the same shape, and therefore only the positioning ribs 46 and 46 for the pair of press-contacting blades 28 and 28 (for the connection of the resistor 72 thereto) will be described here.

As shown in FIG. 5, the positioning rib 46 is larger in size than the press-contacting blade 28, and has such an outer shape that it surrounds the outer periphery of the press-contacting blade 28. The positioning rib 46 has a covering portion insertion groove 47 formed in a central portion thereof, and this covering portion insertion groove 47 is slightly larger in width than the lead portion insertion groove 29 of the press-contacting blade 28, and is similar in shape to the lead portion insertion groove 29, and is open upwardly. The resistor 72 has a covering portion (coating layer) 74 covering an element portion thereof, and the covering portion 74 has tapered smaller-diameter portions formed respectively at end portions of the two lead portions 73. The width of the covering portion insertion groove 47 is generally equal to a diameter of the smaller-diameter portion of the covering portion 74. Namely, the covering portion insertion grooves 47 of the two positioning ribs 46 for the resistor 72 are so positioned as to correspond respectively to the opposite end portions of the covering portion 74 of the resistor 72, and the width of each covering portion insertion groove 47 is larger than the width of the lead portion insertion groove 29 of the press-contacting blade 28 into which the lead portion 73 of the resistor 72 is adapted to be inserted. The positioning rib 46 is larger in size than the press-contacting blade 28, and has such a shape that it surrounds the outer periphery of the press-contacting blade 28, and therefore each positioning rib 46 prevents other members from directly striking against the press-contacting blade 28.

When the resistor 72 (that is, its element portion and lead portions 73 and 73) is to be pressed downward in a direction of an arrow (FIG. 5) by a jig (not shown), first, this resistor 27 is placed on the pair of press-contacting blades 28 and 28, and the smaller-diameter portions of the covering portion 74 of the resistor 72 disposed respectively at the end portions of the pair of lead portions 73 and 73 abut respectively against the covering portion insertion grooves 47 and 47 of the pair of positioning ribs 46 and 46, and therefore the resistor 72 is supported on the pair of positioning ribs 46 and 46. At this time, if the resistor 72 is located out of position, one of tapered larger-diameter portions of the covering portion 74 disposed respectively at the end portions of the lead portions 73 and 73 is located at the covering portion insertion groove 47 of the corresponding positioning rib 46, and therefore the smaller-diameter portions of the covering portion 74 do not abut respectively against the covering portion insertion grooves 47 and 47, so that one of the smaller-diameter portions is lifted relative to the corresponding covering portion insertion groove 47. Therefore, the worker can realize from this that the resistor 72 has not been located in the proper position.

Then, after the smaller-diameter portions of the covering portion 74 of the resistor 72 disposed respectively at the end portions of the pair of lead portions 73 and 73 abut respectively against the covering portion insertion grooves 47 and 47 of the pair of positioning ribs 46 and 46, and hence are supported respectively on the pair of positioning ribs 46 and 46, the element portion and the pair of lead portions 73 and 73 are pressed downward by the jig. By doing so, the smaller-diameter portions of the covering portion 74 are press-fitted respectively into the pair of covering portion insertion grooves 47 and 47, and at the same time the lead portions 73 and 73 are press-fitted respectively into the lead portion insertion grooves 29 and 29 of the press-contacting blades 28 and 28, so that the lead portions 73 and 73 are electrically connected to the press-contacting blades 28 and 28, respectively. Here, the positioning ribs 46 and 46 are disposed in close proximity to the press-contacting blades 28 and 28, respectively, and therefore stresses applied to the press-contacting blades 28 and 28 during this pressing operation effected by the jig are received by the positioning ribs 46 and 46, so that the press-contacting blades 28 and 28 are prevented from tilting and twisting. With respect to the press-contacting blades 30 and 39 for the connection of the Zener diode 75 thereto, first, the positioning of the Zener diode 75 is effected through a covering portion (coating layer) 77 formed on the Zener diode 75, and then the Zener diode 75 is mounted in position as described above for the resistor 72.

In the illumination unit 10, when mounting the pair of bus bars 16 and 17 in the bus bar fixing portion 43 of the housing 11, the positioning ribs 46, 46, 46 and 46 also serve to position the respective press-contacting blades 28, 28, 30 and 39, and therefore the bus bars 16 and 17 can be fixed in position to the bus bar fixing portion 43. Then, the lead portions 61 and 61 of the LED 60 are connected respectively to the press-contacting blades 32 and 41, and the lead portions 73 and 73 of the resistor 72 are connected respectively to the press-contacting blades 28 and 28, and the lead portions 76 and 76 of the Zener diode 75 are connected respectively to the press-contacting blades 30 and 39, and the wires 70 and 70 are connected to the press-contacting blades 26, 26, 37 and 37. Thereafter, the cover 12 is attached to the housing 11, with the retaining projections 18 and 18 of the cover 12 retainingly engaged respectively with the engagement portions 15 and 15 of the housing 11, thus completing the assembling of the illumination unit 10. Then, the illumination unit 10 is fixed to a roof inner panel or other portion of a vehicle body, and is used to illuminate a passenger compartment of the vehicle.

As described above, in the illumination unit 10 employing the electronic part-connecting structure of this embodiment, when the resistor 72 (or the Zener diode 75) is to be electrically connected to the bus bar 16 (or the bus bars 16 and 17), first, the resistor 72 (or the Zener diode 75) is placed on the press-contacting blades 28 and 28 (or the press-contacting blades 30 and 39). At this time, the positioning ribs 46 and 46 disposed in close proximity respectively to the press-contacting blades 28 and 28 (or the press-contacting blades 30 and 39) position the lead portions 73 and 73 of the resistor 72 (or the lead portions 76 and 76 of the Zener diode 75) at the press-contacting blades 28 and 28 (or the press-contacting blades 30 and 39), respectively. The resistor 72 (or the Zener diode 75) has the covering portion 74 (or the coveting portion 77) covering the element portion, and the lead portions 73 and 73 (or the lead portions 76 and 76) project respectively from the opposite ends of the covering portion 74 (or the covering portion 77). Because of the provision of the positioning ribs 46, 46, 46 and 46, each covering portion 74, 77 is not brought into engagement with the press-contacting blades 28 and 28, 30 and 39, but the lead portions 73, 76 are brought into engagement with the respective press-contacting blades 28 and 28, 30 and 39.

Furthermore, the positioning ribs 46, 46, 46 and 46 are disposed in close proximity to the press-contacting blades 28, 28, 30 and 39, respectively, and therefore stresses, applied to the press-contacting blades 28 and 28 (or the press-contacting blades 30 and 39) when the lead portions 73 and 73 of the resistor 72 (or the lead portions 76 and 76 of the Zener diode 75) are press-fitted respectively into the press-contacting blades 28 and 28 (or the press-contacting blades 30 and 39), are received by the positioning ribs 46 and 46. Therefore, the press-contacting blades 28 and 28, as well as the press-contacting blades 30 and 39, can be prevented from tilting and twisting. Therefore, each covering portion 74, 77 will not be connected to the press-contacting blades 28 and 28, 30 and 39, and the lead portions 73 and 73, 76 and 76 are positively connected to the respective press-contacting blades 28 and 28, 30 and 39, and the electrical connection of the resistor 72 and the Zener diode 75 is positively effected, so that the high reliability can be obtained.

Furthermore, in the illumination unit 10 employing the electronic part-connecting structure of this embodiment, when the resistor 72 (or the Zener diode 75) is placed on the press-contacting blades 28 and 28 (or the press-contacting blades 30 and 39), the covering portion 74 of the resistor 72 (or the covering portion 77 of the Zener diode 75) abuts against the covering portion insertion grooves 47 and 47 of the positioning ribs 46 and 46, and is supported by the positioning ribs 46 and 46, and therefore the covering portion 74 (or the covering portion 77) will not be disposed on the press-contacting blades 28 and 28 (or the press-contacting blades 30 and 39). Furthermore, the covering portion insertion grooves 47, 47, 47 and 47 of the positioning ribs 46, 46, 46 and 46 are similar in shape to the lead portion insertion grooves 29, 29, 31 and 40 of the press-contacting blades 28, 28, 30 and 39, and therefore the positioning ribs 46, 46, 46 and 46 will not adversely affect the insertion of the lead portions 73, 73, 76 and 76 at all, and by pressing each of the resistor 72 and the Zener diode 75, only the lead portions 73 and 73, 76 and 76 can be inserted into the lead portion insertion grooves 29 and 29, 31 and 40 of the press-contacting blades 28 and 28, 30 and 39, and can be electrically connected to the respective press-contacting blades.

Furthermore, in the illumination unit 10 employing the electronic part-connecting structure of this embodiment, the press-contacting blades 28, 28, 30 and 39 are formed by bending the stamped-out portions of the bus bars 16 and 17. Therefore, the press-contacting blades 28, 28, 30 and 39 are formed simultaneously when forming the bus bars 16 and 17 into their respective predetermined shapes by pressing and bending, and therefore the bus bars having these press-contacting blades can be produced without using any complicated process, so that the productivity can be enhanced. Furthermore, the positioning ribs 46, 46, 46 and 46 are formed simultaneously when forming the bus bar fixing portion 43 in the molding of the housing 11, and therefore the housing 11 having these positioning ribs can be produced without the need for preparing a new mold and therefore without a large plant investment.

Furthermore, in the illumination unit 10 employing the electronic part-connecting structure of this embodiment, the LED 60 is connected in series with one of the bus bars 16 and 17 and the other of the bus bars 16 and 17, and the resistor 72 is connected in series with the pair of bus bars 16 and 17, and the Zener diode 75 is connected in parallel with the pair of bus bars 16 and 17. With this arrangement, the illumination unit 10 as the electrical equipment can illuminate the passenger compartment of the automobile.

The present invention is not limited to the above embodiment, and suitable modifications, improvements, etc., can be made.

The bus bars mounted on the housing (in the illustrated embodiment) can be replaced by bus bars integrally molded in a housing. The single plate-like bus bars can be replaced by multi-layer bus bar or bus bars.

What is claimed is:

1. An electronic part-connecting structure for use in an electrical equipment comprising:
   a housing; and
   a bus bar which is mounted on said housing and has opposed press-contacting blades to which an electronic part for circuit-protecting purposes is electrically connected by pressing;
   wherein positioning ribs are formed in proximity respectively to said press-contacting blades so as to position said electronic part so that said press-contacting blades will not be press-contacted with a covering portion of lead portions of said electronic part.

2. An electronic part-connecting structure according to claim 1, wherein each of said press-contacting blades has a lead portion insertion groove for the insertion of said lead portion of said electronic part thereinto, and each of said positioning ribs has a covering portion insertion groove for abutting against said covering portion of said electronic part, said covering portion insertion groove being similar in shape to said lead portion insertion groove.

3. An electronic part-connecting structure according to claim 1, wherein said press-contacting blades are formed by bending stamped-out portions of said bus bar, and said positioning ribs are formed at a bus bar fixing portion of said housing.

4. An electronic part-connecting structure according to claim 1, wherein said bus bar comprises a pair of bus bars, and a light source is connected in series with one of said bus bars and the other of said bus bars, and said electronic part is connected in parallel with or in series with said pair of bus bars.

\* \* \* \* \*